United States Patent [19]
Ishida

[11] Patent Number: 5,774,398
[45] Date of Patent: Jun. 30, 1998

[54] NON-VOLATILE SEMICONDUCTOR MEMORY HAVING A MEMORY CELL ARRAY DIVIDED INTO MEMORY CELL GROUPS

[75] Inventor: Shinji Ishida, Kumamoto, Japan

[73] Assignee: NEC Corporation, Japan

[21] Appl. No.: 755,410

[22] Filed: Nov. 22, 1996

[30] Foreign Application Priority Data

Nov. 29, 1995 [JP] Japan ..................................... 7-311261

[51] Int. Cl.⁶ .................................................. G11C 11/34
[52] U.S. Cl. .............................. 365/185.11; 365/185.02; 365/185.09; 365/185.16; 365/185.29
[58] Field of Search .......................... 365/185.11, 185.16, 365/185.09, 185.29, 185.02

[56] References Cited

U.S. PATENT DOCUMENTS

| | | | |
|---|---|---|---|
| 5,426,611 | 6/1995 | Maruyama | 365/218 |
| 5,521,867 | 5/1996 | Chen et al. | 365/185.33 |
| 5,526,309 | 6/1996 | Jinbo | 365/185.29 |
| 5,592,415 | 1/1997 | Kato et al. | 365/185.01 |
| 5,594,689 | 1/1997 | Kato | 365/185.22 |
| 5,621,689 | 4/1997 | Sakakibara et al. | 365/189.09 |
| 5,621,690 | 4/1997 | Jungroth et al. | 365/200 |

FOREIGN PATENT DOCUMENTS

5-274894  10/1993  Japan .

Primary Examiner—David C. Nelms
Assistant Examiner—Hien Nguyen

[57] ABSTRACT

Digit lines 31 to 34 and word lines 35 to 38 are provided. NMOS transistors 1 to 4 serving as Y selectors, a memory cell divided into two memory cell groups 25 and 26, a write circuit 21, a sense amplifier 22, a Y decoder 23, an X decoder 24, and a selector for selecting the memory cell groups 25 and 26 are provided in correspondence to the digit and word lines. The selector includes a PMOS transistor 27 and NMOS transistors 28 to 30. The memory cell group 25 is selected when a most significant address bit signal 101 is inputted as "0" level signal, and the memory cell group 26 is selected when the signal 101 is inputted as "1" level signal.

4 Claims, 5 Drawing Sheets

NON-VOLATILE SEMICONDUCTOR MEMORY HAVING A MEMORY CELL ARRAY DIVIDED INTO MEMORY CELL GROUPS

BACKGROUND OF THE INVENTION

The present invention relates to semiconductor memories and, more particularly, to non-volatile semiconductor memories using floating transistors as memory cells and capable of electric re-writing.

Figure 4A:
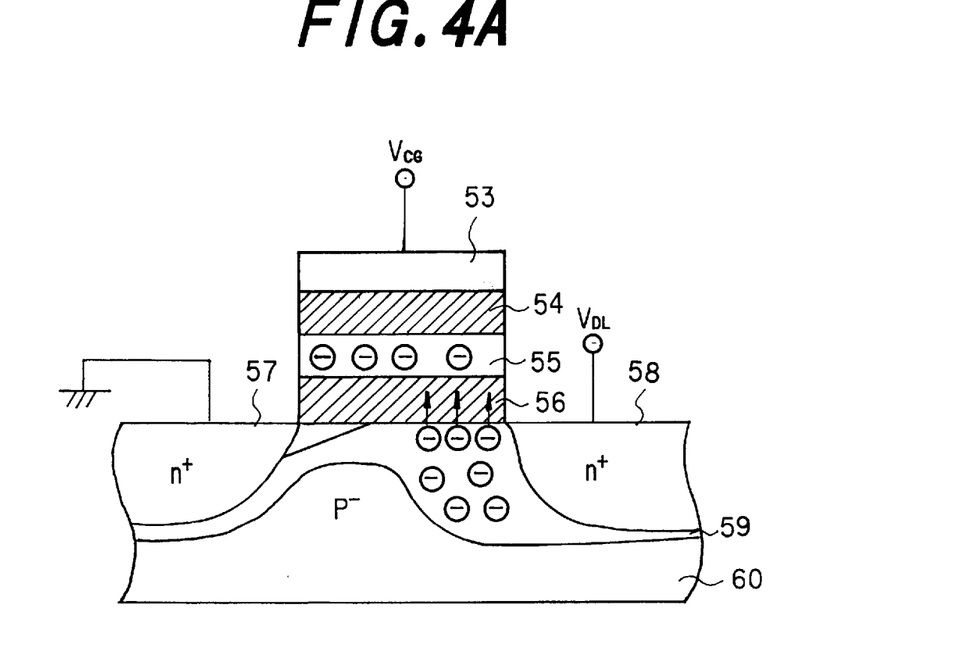
FIG. 4A is a sectional view showing the structure of the conventional memory cell and FIG. 4B is a simplified sectional view showing the same structure.
Figure 4B:
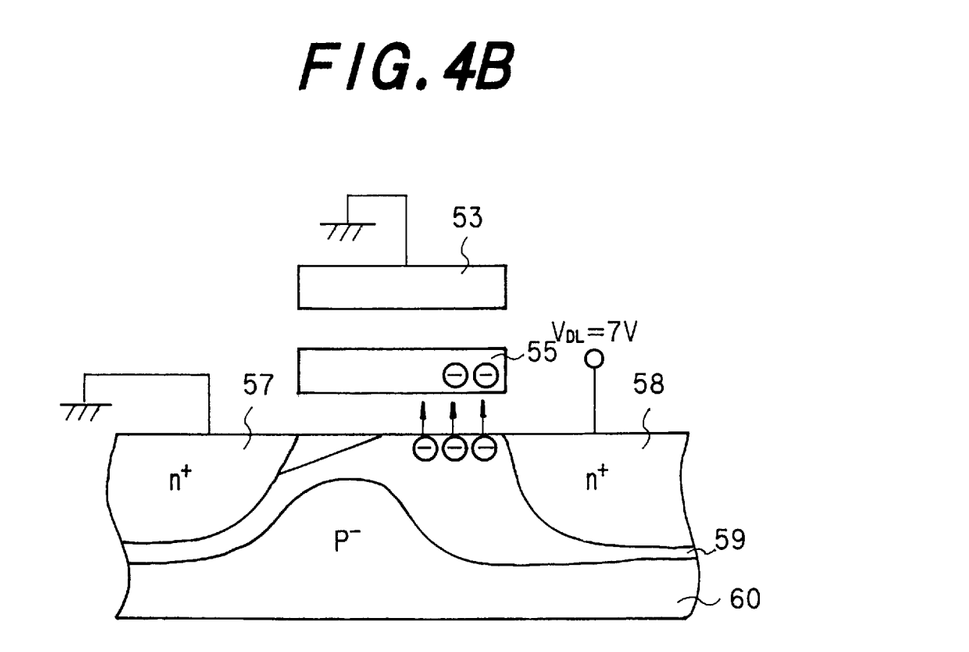

A semiconductor memory of this type has been proposed in Japanese Laid-Open Patent Publication No. 5-274894. FIG. 4A is a sectional view showing the structure of the memory cell in the proposed semiconductor memory, and FIG. 4B is a simplified sectional view showing the same structure. As shown in FIG. 4A, the memory cell has an n-type diffusion layer 58 serving as a drain and an n-type diffusion layer 57 serving as a source, these layers being formed in a p-type semiconductor substrate 60. A tunnel oxide film 56 is formed on the substrate 60, and a floating gate 55 is formed on the tunnel oxide film 56. An oxide film 54 is formed on the floating gate 55, and a control gate 53 is formed on the oxide film 54.

When writing data in such a memory cell, high voltages of $V_{CG}=12$ V and $V_{DL}=7$ V are applied to the control gate 53 and the n-type diffusion layer 58, respectively. As a result, a channel current is generated in a channel region and caused to flow between the n-type diffusion layer (source) 57 and the n-type diffusion layer (drain) 58. Subsequently, a depletion layer 59 is developed in the neighborhood of the n-type diffusion layer (drain) 58 and reaches a pinch-off point. A high electric field that is established in the depletion layer 59 accelerates electrons, causing some of these electrons (hot electrons) to clear the energy barrier of the oxide film 56 and be injected into the floating gate 55. With the injection of electrons into the floating gate 55, this memory cell comes up with its written state. In this written state, the threshold voltage $V_{TH}$ of the memory cell is about 7 V. Erasing of the written content in the memory cell is made by irradiating the memory cell with ultra-violet rays and thus causing the electrons in the floating gate 55 to clear the energy barrier in the oxide film 54 and be released. By this erasing operation, the number of electrons in the floating gate 55 is reduced to bring about an erased state. In this operation, the threshold voltage VTH is reduced to about 2 V.

A basic operation of reading out data will now be described with reference to FIGS. 4A and 4B. A check as to whether the memory cell is in the written state ("0") or the erased state ("1") is made by checking whether the memory cell is turned on, that is, the channel current is caused therein, by applying a voltage of approximately $V_{CG}=V_{DL}=5$ V to the control gate 53 and the n-type diffusion layer (drain) 58. When the data has been written in the memory cell, that is, when electrons have been injected into the floating gate 55, the threshold voltage $V_{TH}$ is increased to about 6 V. In consequence, the memory cell comes up with its "off" state. When the memory is in the erased state, $V_{TH}$ is about 2 V, and the memory cell comes up with its "on" state.

Figure 3:
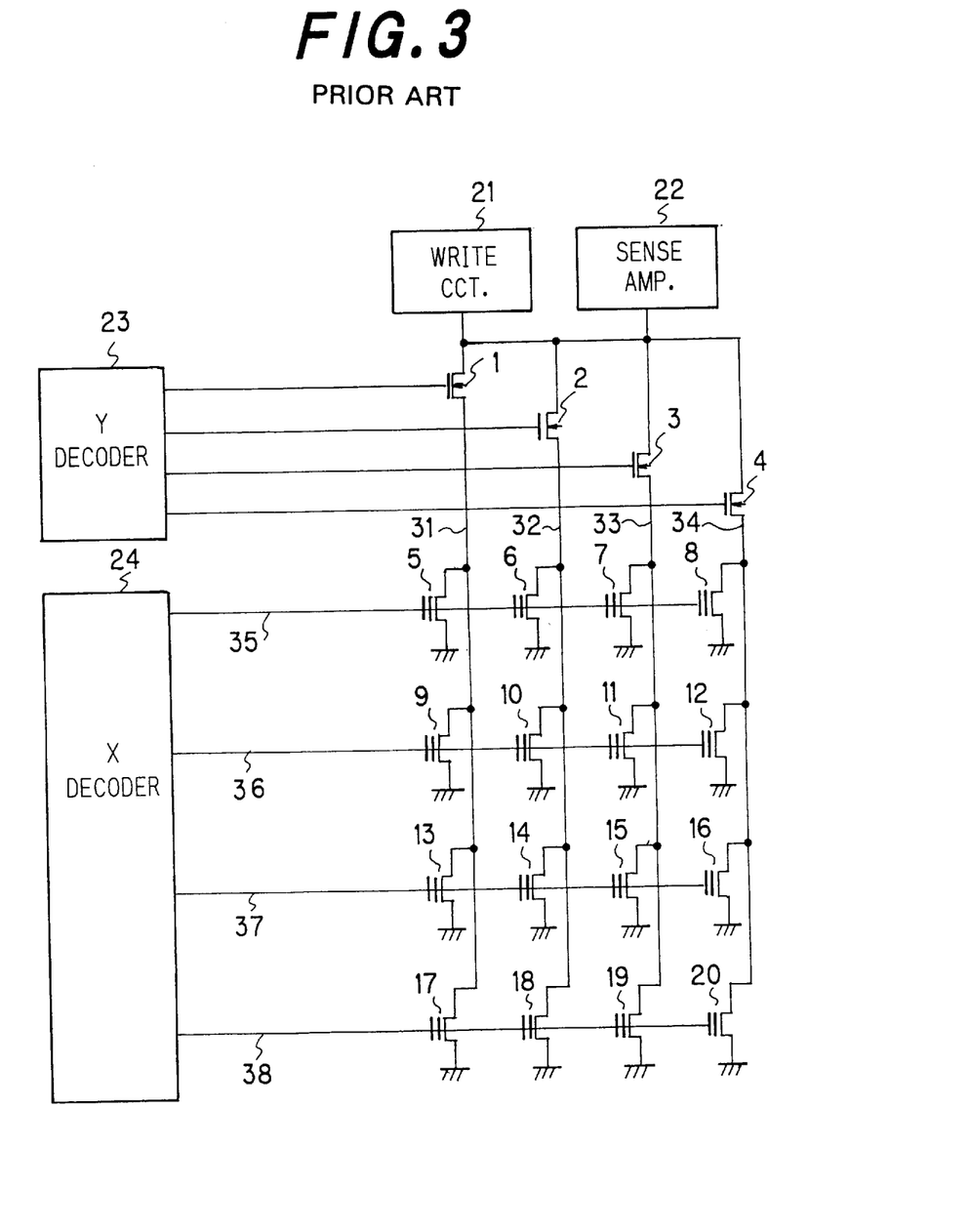
FIG. 3 is a circuit of the conventional circuit for write operation and read operation.

The write operation and read operation in this prior art system will now be described with reference to FIG. 3 showing the structure of the prior art system. As shown, the system comprises digit lines 31 to 34 and word lines 35 to 38, and also comprises, in correspondence to these lines, NMOS transistors 1 to 4 serving as Y selectors, memory cells 5 to 20 constituting a memory cell array, a write circuit 21, a sense amplifier 22, a Y decoder 23, and an X decoder 24.

To write the data in, for instance, the memory cell 11 in FIG. 3, a high voltage of about 7 V is applied to the digit line 33 from the write circuit 21 by causing the Y decoder 23 to turn on the NMOS transistor 3, while a high voltage of about 12 V is applied to the word line 36 by the X decoder 24. In this way, the data is written in the memory cell 11, and the threshold voltage VTH thereof is brought to about 6 V. To read out the data from the memory cell 11 in the written state, the on/off state of the memory cell 11 is checked by applying a voltage of about 5 V to the word line 36 from the X decoder 24. In the instant case, the memory cell 11 is "off" and no current is flown since its threshold voltage VTH is about 6 V. The sense amplifier 22 detects this states and outputs a "0" level signal.

To read out the data from a memory cell in the erased state, for instance memory cell 7, a voltage of about 5 V is applied to the word line 35 from the X decoder 24. As a result, the memory cell 7 is turned on since its threshold voltage $V_{TH}$ has been about 2 V, thus causing current through it. The sense amplifier 22 detects this state of the memory cell 7 and provides an output of "1".

When writing the data, a problem is posed in connection with the state of the memory cells in the non-written state. This problem will now be discussed with reference to FIG. 3 and also to FIG. 4B which is a simplified sectional view showing a memory cell. In FIG. 4B, parts like those shown in FIG. 4A are designated by like reference numerals. When writing data in, for instance, the memory cell 11 (see FIG. 3), the non-written state memory cell 15 (see FIG. 3), for instance, has its control gate (source) 53 (see FIG. 4B) and its n-type diffusion layer 57 (see FIG. 4B) held at 0 V, while its n-type diffusion layer (drain) 58 (see FIG. 4B is held at about 7 V. With this high voltage applied to the n-type diffusion layer (drain) (see FIG., 4B), the potential on the floating gate 55 (see FIG. 4B) is increased to result in channel formation, thus causing electron movement and generating a current. Collision polarization is therefore caused by electrons in the depletion layer 57 (see FIG. 4B) which is under a high electric field, generating hot electrons to be injected into the floating gate 55 (see FIG. 4B) and increase the threshold voltage $V_{TH}$. This is called a drain disturb phenomenon.

To read out the data from this non-written state memory cell 15 (see FIG. 3), the on-off state thereof is checked by applying a voltage of about 5 V to the word line 38 (see FIG. 3) from the X decoder 24 (see FIG. 3). Normally the memory cell 15 (see FIG. 3) is in the erased state (because its threshold voltage $V_{TH}$ is about 2 V), and it is thus turned on to cause current through it. When the sense amplifier 22 detects this current, it provides "1" as the output. When the drain disturb phenomenon occurs, however, speed deterioration results from an increase of the threshold voltage $V_{TH}$. When the deterioration becomes significant, an erroneous operation occurs. More specifically, with an increase of the threshold voltage $V_{TH}$ the memory cell (see FIG. 3) is turned off so that it no longer carries any current. In this case, the amplifier 22 provides "0" as its output.

Figure 5:
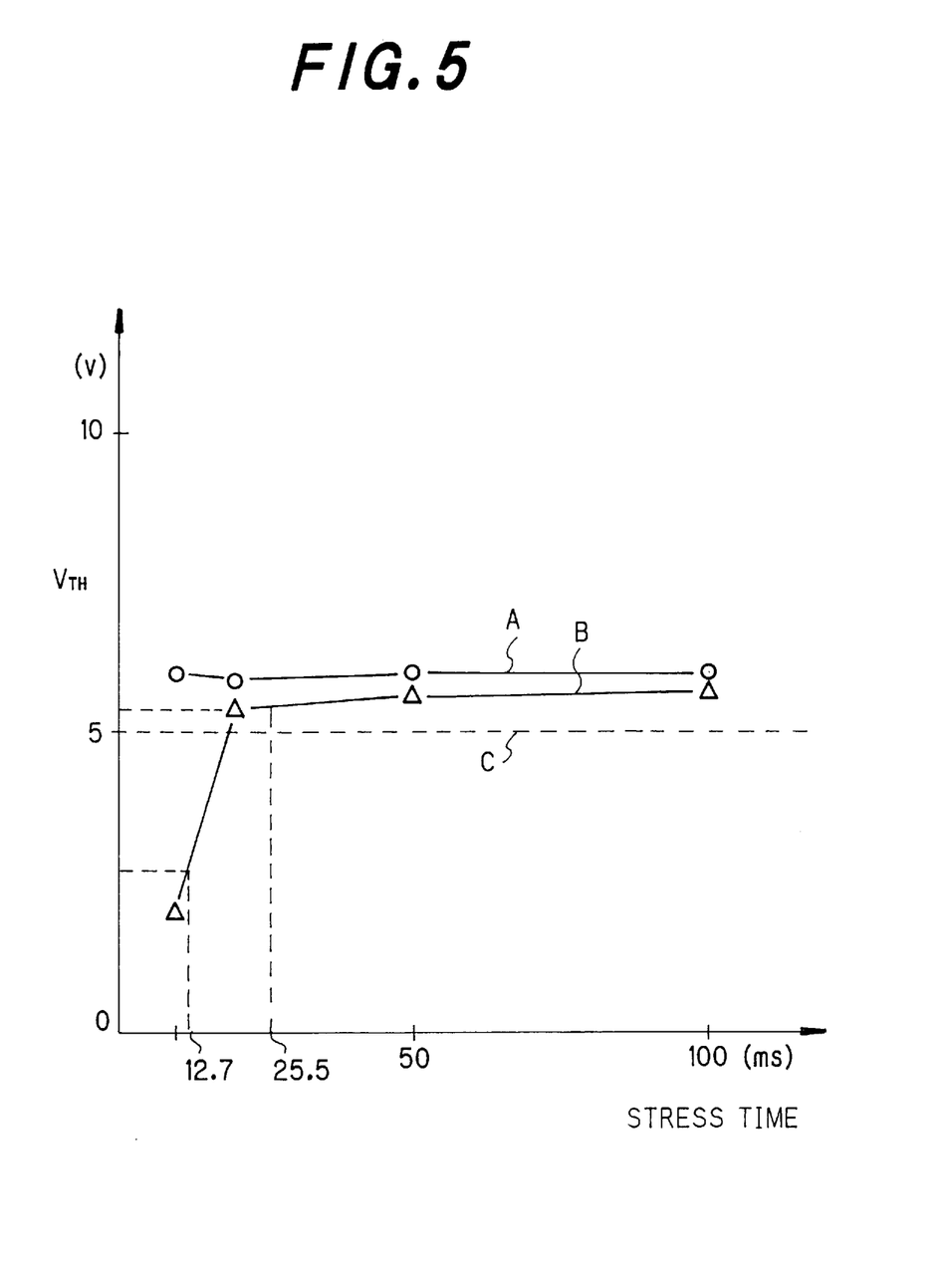
FIG. 5 is a graph showing relationship between the stress time and the threshold voltage.

This phenomenon will be described in greater details with reference to FIG. 5 as well.

It is assumed that the memory cells have a 256×256 bit structure and that the write time per memory cell is 100 $\mu$s. In this case, 256 memory cells are connected to the same digit line, and the writing data causes a stress of 255×100 $\mu$s to be caused per memory cell by the drain disturb. The stress occurrence for 25.5 ms in the non-written memory cell results in an increase of the threshold voltage $V_{TH}$ from 2 V to about 5.5 V, which leads to erroneous recognition of the erased state to be the written state when reading out the data.

This erroneous operation when reading out the data due to the drain disturb, is particularly possible with the erased memories. The greater the number of memory cells connected to the same digit line, the stress noted above is caused the more, and the threshold voltage $V_{TH}$ is the more apt to be increased, thus increasing the possibility of the erroneous operation when reading out the data.

As shown, the prior art semiconductor memory described above has a drawback that when writing the data in a given memory cell, the threshold voltage $V_{TH}$ of the non-selected memory cells connected to the same digit line is increased by a high voltage applied thereto to result in erroneous recognition of an erased memory cell to be a written memory cell.

SUMMARY OF THE INVENTION

An object of the present invention is therefore to provide a non-volatile semiconductor memory capable of suppressing the increase of the threshold voltage of the erased state memory cells and eliminating the erroneous operation in the data writing operation.

According to one aspect of the present invention, there is provided a non-volatile semiconductor memory, comprising: a memory cell array divided into a plurality of memory cell groups; and memory cell group selecting means controlled in a data writing operation by a predetermined memory cell group select control signal to select a memory cell group including a given memory cell for writing data therein in the memory cell array, and ground the source of said selected memory cell group, while holding the source of any other memory cell group than said selected memory cell group open-circuited.

The memory cell array is divided along word lines thereof into said plurality of memory cell groups.

The memory cell array is divided into a first and a second memory cell group and the memory cell group selecting means including: a PMOS transistor supplied with a power voltage at the source and receiving said memory cell group select control signal at the gate; a first NMOS transistor having the drain connected to the drain of said PMOS transistor, receiving the memory cell group select control signal at the gate, and having the source grounded; a second NMOS transistor having the drain connected to the source of said first memory cell group, having the gate connected to the drain of said PMOS transistor, and having the source grounded; and a third NMOS transistor having the drain connected to the source of said memory cell group, receiving said memory cell group select control signal at the gate, and having the source grounded; the memory cell group select control signal being set according to the level of a most significant address bit signal.

The memory cell array is divided into a first, a second, a third and a fourth memory cell groups, the memory cell group selecting means including: a first NOR gate for outputting a logical NOR output of a first and a second memory cell group select control signal; a first inverter for outputting the inversion of the second memory cell group select control signal; a second NOR gate for outputting a logical NOR output of the first memory cell group select control signal and the second memory cell group select signal inversion from the first inverter; a second inverter for outputting the inversion of the first memory cell group select control signal; a third NOR circuit for outputting a logical NOR output of the first memory cell group select control signal inversion from the second inverter and the second memory cell group select control signal; a fourth NOR gate for outputting a logical NOR output of the first memory cell group select signal inversion from the second inverter and the second memory cell group select control signal inversion from the first inverter; a first NMOS transistor having the drain connected to the source of the first memory cell group, having the gate connected to the output terminal of the first NOR gate, and having the source grounded; a second NMOS transistor having the drain connected to the source of the second memory cell group, having the gate connected to the output terminal of the second NOR gate, and the source grounded; and a fourth NMOS transistor having the drain connected to the source of the fourth memory cell group, having the gate connected to the output terminal of the fourth NOR gate, and having the source grounded; the first memory cell group select control signal being set according to the most significant address bit signal level, the second memory cell group select control signal being set according to the level of a most-but-one address bit signal.

According to other aspect of the present invention, there is provided a non-volatile semiconductor memory comprising a plurality of transistors serving as Y selector corresponding to a plurality of digit lines and a plurality of word lines, a memory array cell divided into a plurality of groups each consisting of a plurality of memory cells, a write circuit and a sense amplifier corresponding to the digit lines, a Y decoder connected to the transistors, an X decoder connected to the word lines, and a selector for selecting tone of the memory cells. The plurality of groups is 2 or 4.

Other objects and features will be clarified from the following description with reference to attached drawings.

PREFERRED EMBODIMENTS OF THE INVENTION

Figure 1:
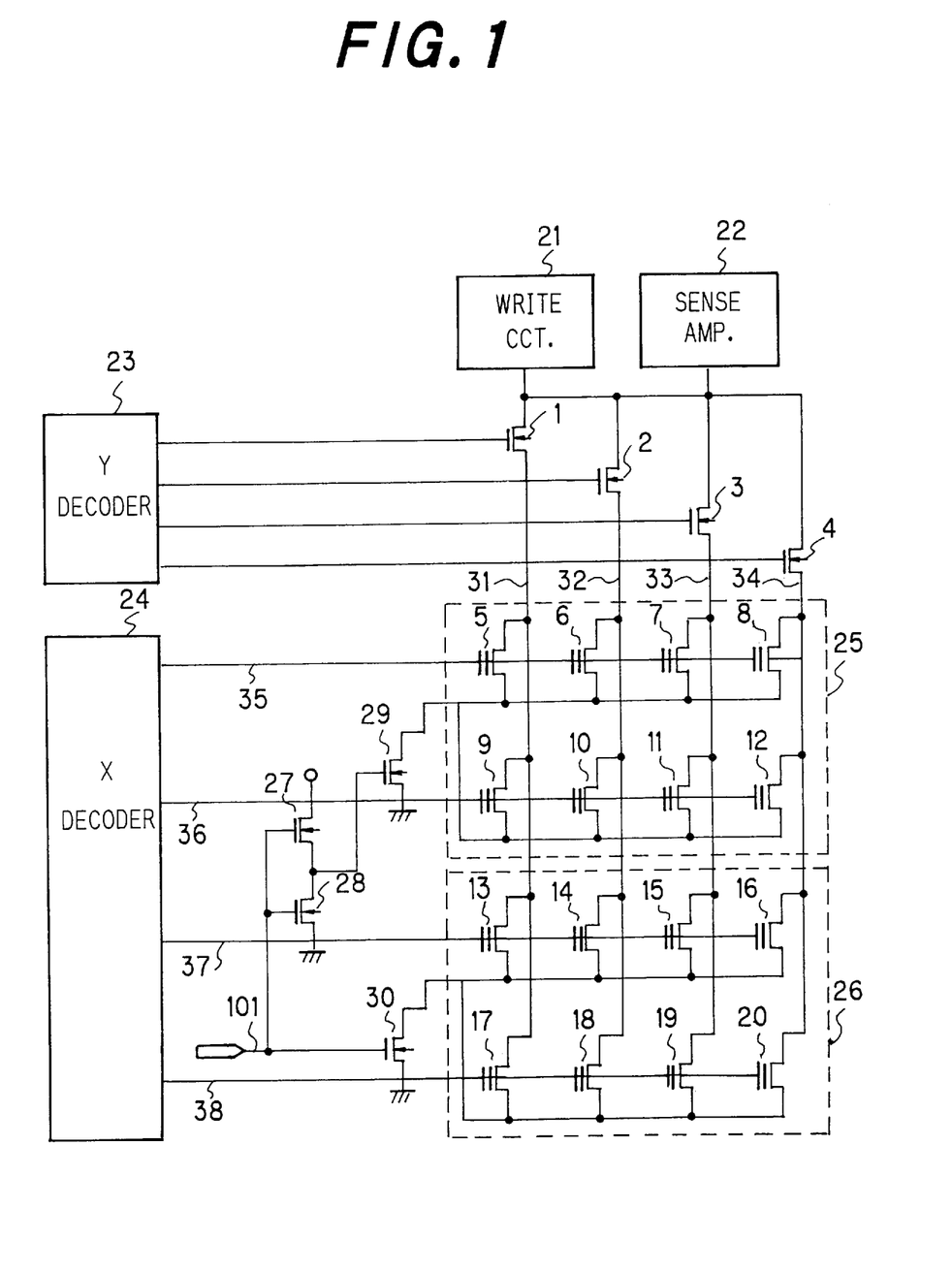
FIG. 1 is a schematic view showing a first embodiment of the present invention.

FIG. 1 is a schematic view showing a first embodiment of the present invention. As shown, this embodiment comprises digit lines 31 to 34 and word lines 35 to 38, and further comprises, in correspondence to these lines, NMOS transistors 1 to 4 serving as Y selectors, a memory array cell divided into two groups, i.e., a memory cell group 25 consisting of memory cells 5 to 12, and a memory cell group 26 consisting of memory cells 13 to 20, a write circuit 21, a sense amplifier 22, a Y decoder 23, an X decoder 24, and a selector for selecting the memory cell groups 25 and 26, the selector including a PMOS transistor 27 and NMOS transistors 28 to 30. The memory cell group 25 is selected when a most significant address bit signal 101 is inputted as "0" level signal, and the memory cell group 26 is selected when the signal 101 is inputted as a "1" level signal.

First, the write operation will be described. To write the data in, for instance, the memory cell 11 in the system shown in FIG. 1, a high voltage of about 7 V is applied to the digit line 33 from the write circuit 21 by turning on the NMOS transistor 3 serving as Y selector by the Y decoder 23. In the meantime, the most significant address bit signal 101 is inputted as "0" level signal. As a result, the PMOS transistor 27, and hence the NMOS transistor 29, are turned on to ground the source of the memory cell group 26 through the NMOS transistor 29. However, the source of the other memory cell group 26 is held open-circuited since the NMOS transistor 30 is held "off". In this state, the data is written in the memory cell 11, and the threshold voltage $V_{TH}$ thereof is brought to about 6 V.

In the prior art, as described before, the data writing operation such as above gives rise to an increase of the threshold voltage $V_{TH}$ of the non-written state memory cell 15 due to the adverse effect of the drain disturb, and to consequent erroneous operation in the data reading operation. In this embodiment, the memory cell array is divided into the two memory cell groups 25 and 26 such that either one thereof is selectable according to the most significant address bit signal 101. With this arrangement, the source of the memory cell group 26 which includes the memory cell 15 is held open-circuited and hardly subject to adverse effects of drain disturb in the instant data writing operation. It is thus possible to eliminate an increase of the threshold voltage $V_{TH}$ of the memory cell 15. Even in such a case where the selected memory cell for writing data therein may belong to the same memory cell group as the non-written state memory cells, the degree of adverse effects of the drain disturb is reduced to one half compared to the prior art because of the division of the memory cells into the two groups. Thus, the threshold voltage $V_{TH}$, although possibly increased slightly, is not increased to such an extent as to cause erroneous operation in the data reading operation.

A specific example of this embodiment, in which the selected memory cell belongs to the same memory cell group as the non-written state memory cells, will now be described with reference to FIG. 5. FIG. 5 is a graph showing the relation between the level of the threshold voltage $V_{TH}$ and the time of presence of stress. Curve A represents the threshold voltage of the written state memory cell. Curve B represents the threshold voltage of the erased state memory cell. Curve C represents the word line voltage in the data reading operation.

As an example, it is assumed that the memory cells constitute a 256×256 bit structure and that the write time per memory cell is 100 μs. In this case, 256 memory cells are connected to the same digit line, and in the data writing operation each memory cell is given a stress for 255×100 μs (i.e., 25.5 ms) by the drain disturb. In the prior art, as described above, the threshold voltage $V_{TH}$ of the non-written state memory cell is consequently increased from 2 V to 5.5 V. In this embodiment in which the memory cell array is divided into the two groups, the stress generation in each memory cell is reduced to about one half compared to the prior art system, i.e., only about 127×100 μm (12.7 ms). Accordingly, in this embodiment the threshold voltage $V_{TH}$ is increased from 2 V only up to about 2.7 V which is not so high as to cause erroneous operation in the data reading operation.

As described above, with this embodiment in which the memory cell array is divided into the two groups, the stress generated in the non-selected memory cells in the data writing operation can be reduced to eliminate erroneous operation therein.

A second embodiment of the present invention will now be described.

Figure 2:
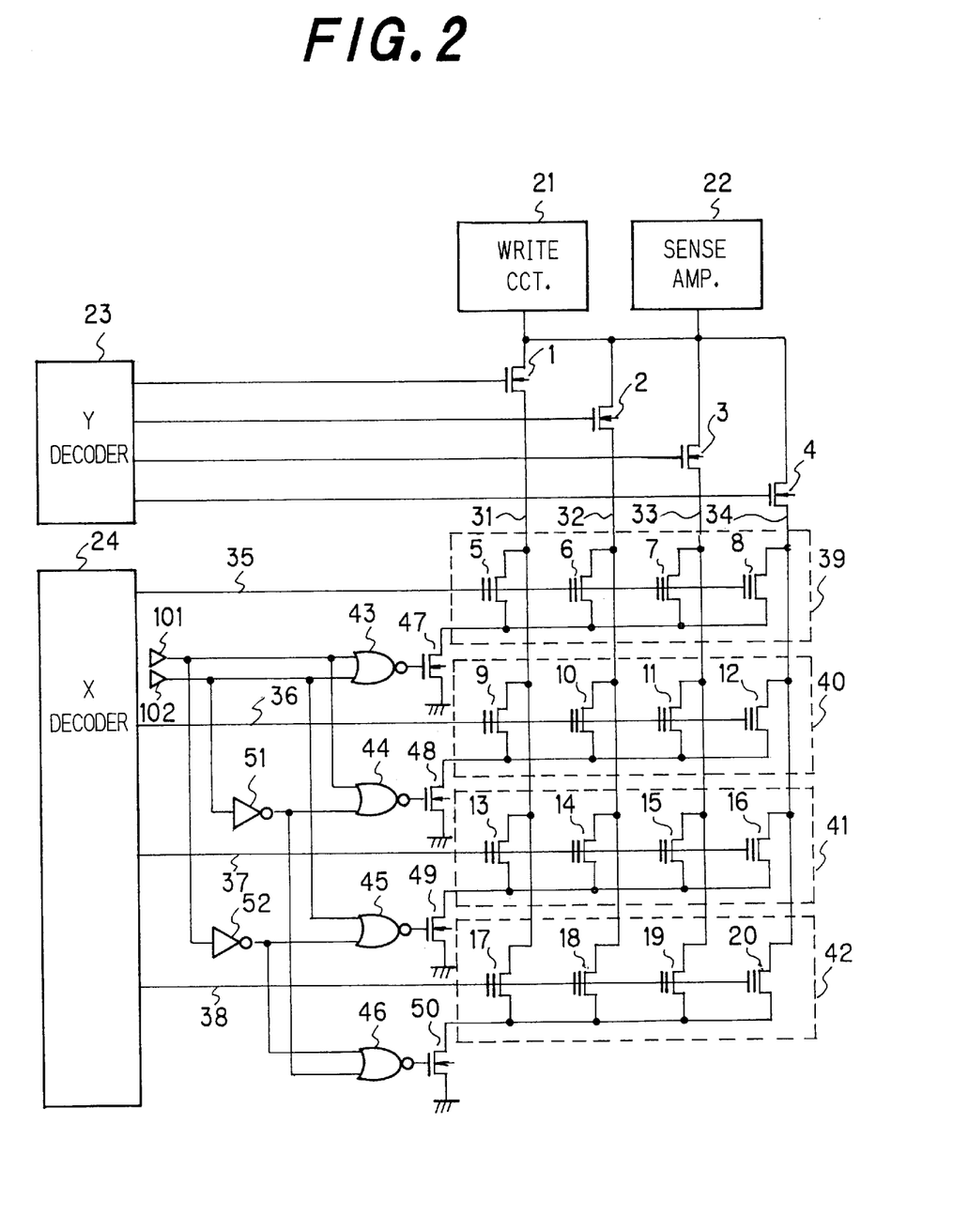
FIG. 2 is a schematic view showing the second embodiment of the present invention.

FIG. 2 is a schematic view showing the second embodiment. As shown, this embodiment comprises digit lines 31 to 34 and word lines 35 to 38, and also comprises, in correspondence to these lines, NMOS transistors 1 to 4 serving as Y selectors, a memory cell array divided into four memory cell groups, i.e., a memory cell group 39 consisting of memory cells 5 to 8, a memory cell group 40 consisting of memory cells 9 to 12, a memory cell group 41 consisting of memory cells 13 to 16 and a memory cell group 42 consisting of memory cells 17 to 20, a write circuit 21, a sense amplifier 22, a Y decoder 23, an X decoder 24, and a selector for selecting the memory cell groups 39 to 42 in the four-group memory cell array, the selector including inserters 51 and 52, NOR gates 43 to 46 and NMOS transistors 47 to 50. When a most significant address bit signal 101 is inputted as "0" level signal while a most-but-one significant address bit signal 102 is inputted also as "0" level signal, the memory cell group 39 is selected. When the signal 101 is inputted as "0" level input while the signal 102 is inputted as "1" level signal, the memory cell group 40 is selected. When the signal 101 is inputted as "1" level signal while the signal 102 is inputted as "0" level signal, the memory cell group 41 is selected. When the signal 101 is inputted as "1" level signal while the signal 102 is inputted as "1" level signal, the memory cell group 42 is selected.

The data writing operation in this embodiment will now be described.

When writing the data in, for instance, the memory cell 11, a high voltage of about 7 V is applied to the digit line 33 from the write circuit 21 by applying "1" level signal to and thus turning on the NMOS transistor 3 serving as the Y selector from the Y decoder 23, while a high voltage of about 12 V is applied to the word line 36 from the X decoder 24. In the meantime, the most significant address bit signal 101 is inputted as "0" level signal, and the most-but-one significant address 102 is inputted as "1" level signal. In receipt of these signals 101 and 102, the selector which includes the inverters 51 and 52, the NOR gates 44 to 46 and the NMOS transistors 48 to 50, grounds the source of the memory cell group 40 through the NMOS transistor 48, while holding the other memory cell groups 39, 41 and 42 open-circuited. As a result, the data is written in the memory cell 11, and the threshold voltage $V_{TH}$ is brought to about 6 V.

In the prior art, as described above, the writing operation such as above gives rise to an increase of the threshold voltage $V_{TH}$ of the non-written state memory cell 15 due to the adverse effect of the drain disturb, and to consequent erroneous operation in the data reading operation. In this embodiment, the memory cell array is divided into the four memory cell groups such that either one thereof is selectable according to the most significant address bit signal 101 and the most-but-one significant address bit signal 102. Thus, the source of the memory cell group 41 which includes the memory cell 15 is held open-circuited and hardly subject to adverse effects of drain disturb in the instant data writing operation. It is thus possible to eliminate an increase of the threshold voltage $V_{TH}$ of the memory cell 15. Even in such a case where the selected memory cell for writing the data therein may belong to the same memory cell group as non-written state memory cells, the degree of adverse effects of the drain disturb is reduced more than the case of the above first embodiment in correspondence to the number of memory cell groups, which is four in this embodiment. Thus, the threshold voltage $V_{TH}$, although possibly increased slightly, is not increased to such an extent as to cause erroneous operation in the data reading operation. A specific example of this embodiment, in which the selected memory cell belongs to the same memory cell group as the non-selected memory cells, will now be described with reference to FIG. 5.

As an example, it is assumed that the memory cells constitute a 256×256 bit structure and that the write time per memory cell is 100 μm. In this case, 256 memory cells are connected to the same digit line, and in the data writing operation each memory cell is given a stress for 255×100 μm (i.e., 25.5 ms) by the drain disturb. In the prior art, as described above, the threshold voltage $V_{TH}$ of the non-written state memory cell is consequently increased from 2 V to 5.5 V. In this embodiment, in which the memory cell array is divided into four groups, the stress generation in each memory cell is reduced to about one fourth compared to the prior art system, i.e., only about 63×100 μs (6.6 ms). This means that in this embodiment the threshold voltage $V_{TH}$ is not substantially increased, erroneous operation does not occur in the data reading operation.

As described above, with this embodiment in which the memory cell array is divided into the four groups, the stress generated in the non-selected memory cells in the data writing operation can be reduced to eliminate the increase of the threshold voltage $V_{TH}$ and consequent erroneous operation in the data writing operation.

While in the above embodiments the memory cell array was divided into two and four groups, it is naturally possible to further reduce stress generated in the non-selected memory cells so as to provide pronounced function of suppressing the increase of the threshold voltage $V_{TH}$ and improved effect of preventing erroneous operation in the data writing operation.

While in the above embodiments the source of the non-selected memory cell group or groups were held open-circuited to reduce adverse effects of drain disturb, it is possible as well to hold the source at the same voltage as the digit lines to reduce adverse effects of drain disturb.

As has been described in the foregoing, according to the present invention the memory cell array is divided into a plurality of memory cell groups, and the source of the memory cell group including the selected memory cell is grounded, while holding the source of the other memory cell group or groups open-circuited, whereby adverse effects of drain disturb on the non-selected memory cells are reduced to suppress increase of the threshold voltage of the erased state memory cells and eliminate erroneous operation in the data writing operation.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A non-volatile semiconductor memory comprising:
   a memory cell array divided into a first and a second memory cell group; and
   memory cell group selecting means controlled in a data writing operation by a predetermined memory cell group select control signal to select a memory cell group including a given memory cell for writing data therein in the memory cell array, and around the source of the selected memory cell group, while holding the source of any other memory cell group than the selected memory cell group open-circuited;

the memory cell group selecting means including:
   a PMOS transistor supplied with a power voltage at the source and receiving the memory cell group select control signal at the gate;
   a first NMOS transistor having the drain connected to the drain of the PMOS transistor, receiving the memory cell group select control signal at the gate, and having the source grounded;
   a second NMOS transistor having the drain connected to the source of the first memory cell group, having the gate connected to the drain of the PMOS transistor, and having the source grounded; and
   a third NMOS transistor having the drain connected to the source of the memory cell group, receiving the memory cell group select control signal at the gate, and having the source grounded;
   the memory cell group select control signal being set according to the level of a most significant address bit signal.

2. A non-volatile semiconductor memory comprising:
   a memory cell array divided into a first, a second, a third and a fourth memory cell group; and
   memory cell group selecting means controlled in a data writing operation by a predetermined memory cell group select control signal to select a memory cell group including a given memory cell for writing data therein in the memory cell array, and ground the source of the selected memory cell group, while holding the source of any other memory cell group than the selected memory cell group open-circuited;

the memory cell group selecting means including:
   a first NOR gate outputting the logical NOR output of a first and a second memory cell group select control signal;
   a first inverter outputting the inversion of the second memory cell group select control signal;
   a second NOR gate outputting the logical NOR output of the first memory cell group select control signal and the second memory cell group select signal inversion from the first inverter;
   a second inverter outputting the inversion of the first memory cell group select control signal;
   a third NOR circuit outputting the logical NOR output of the first memory cell group select control signal inversion from the second inverter and the second memory cell group select control signal;
   a fourth NOR gate outputting the logical NOR output of the first memory cell group select signal inversion from the second inverter and the second memory cell group select control signal inversion from the first inverter;
   a first NMOS transistor having the drain connected to the source of the first memory cell group, having the gate connected to the output terminal of the first NOR gate, and having the source grounded;
   a second NMOS transistor having the drain connected to the source of the second memory cell group, having the gate connected to the output terminal of the second NOR gate, and the source grounded; and
   a fourth NMOS transistor having the drain connected to the source of the fourth memory cell group, having the gate connected to the output terminal of the fourth NOR gate, and having the source grounded;
   the first memory cell group select control signal being set according to the most significant address bit signal level, the second memory cell group select control signal being set according to the level of a most-but-one address bit signal.

3. A non-volatile semiconductor memory comprising:

a memory cell array divided along word lines thereof into a first and a second memory cell group; and memory cell group selecting means controlled in a data writing operation by a predetermined memory cell group select control signal to select a memory cell group including a given memory cell for writing data therein in the memory cell array, and around the source of the selected memory cell group, while holding the source of any other memory cell group than the selected memory cell group open-circuited;

the memory cell group selecting means including:

a PMOS transistor supplied with a power voltage at the source and receiving the memory cell group select control signal at the gate;

first NMOS transistor having the drain connected to the drain of the PMOS transistor, receiving the memory cell group select control signal at the gate, and having the source grounded;

a second NMOS transistor having the drain connected to the source of the first memory cell group, having the gate connected to the drain of the PMOS transistor, and having the source grounded; and a third NMOS transistor having the drain connected to the source of the memory cell group, receiving the memory cell group select control signal at the gate, and having the source grounded;

the memory cell group select control signal being set according to the level of a most significant address bit signal.

4. A non-volatile semiconductor memory comprising:

a memory cell array divided along word lines thereof into a first, a second, a third and a fourth memory cell group; and memory cell group selecting means controlled in a data writing operation by a predetermined memory cell group select control signal to select a memory cell group including a given memory cell for writing data therein in the memory cell array, and around the source of the selected memory cell group, while holding the source of any other memory cell group than the selected memory cell group open-circuited;

the memory cell group selecting means including:

a first NOR gate outputting the logical NOR output of a first and a second memory cell group select control signal;

a first inverter outputting the inversion of the second memory cell group select control signal;

a second NOR gate outputting the logical NOR output of the first memory cell group select control signal and the second memory cell group select signal inversion from the first inverter;

second inverter outputting the inversion of the first memory cell group select control signal;

a third NOR circuit outputting the logical NOR output of the first memory cell group select control signal inversion from the second inverter and the second memory cell group select control signal;

a fourth NOR gate outputting the logical NOR output of the first memory cell group select signal inversion from the second inverter and the second memory cell group select control signal inversion from the first inverter;

a first NMOS transistor having the drain connected to the source of the first memory cell group, having the gate connected to the output terminal of the first NOR gate, and having the source grounded;

a second NMOS transistor having the drain connected to the source of the second memory cell group, having the gate connected to the output terminal of the second NOR gate, and the source grounded; and a fourth NMOS transistor having the drain connected to the source of the fourth memory cell group, having the gate connected to the output terminal of the fourth NOR gate, and having the source grounded;

the first memory cell group select control signal being set according to the most significant address bit signal level, the second memory cell group select control signal being set according to the level of a most-but-one address bit signal.

* * * * *